US012671055B2

(12) United States Patent
Marsik

(10) Patent No.: US 12,671,055 B2
(45) Date of Patent: Jun. 30, 2026

(54) TILTING ELEMENT OF MANIPULATION STAGE

(71) Applicant: Tescan Group A.S., Brno (CZ)

(72) Inventor: Jiri Marsik, Veverska Bityska (CZ)

(73) Assignee: Tescan Group A.S., Brno (CZ)

( * ) Notice: Subject to any disclaimer, the term of this patent is extended or adjusted under 35 U.S.C. 154(b) by 632 days.

(21) Appl. No.: 18/042,291

(22) PCT Filed: Aug. 23, 2021

(86) PCT No.: PCT/CZ2021/050091
§ 371 (c)(1),
(2) Date: Feb. 20, 2023

(87) PCT Pub. No.: WO2022/042779
PCT Pub. Date: Mar. 3, 2022

(65) Prior Publication Data
US 2023/0326708 A1     Oct. 12, 2023

(30) Foreign Application Priority Data
Aug. 27, 2020     (CZ) ................................. CZ2020-474

(51) Int. Cl.
*H01J 37/20*          (2006.01)
*H01J 37/26*          (2006.01)
(52) U.S. Cl.
CPC .............. *H01J 37/20* (2013.01); *H01J 37/26* (2013.01); *H01J 2237/20207* (2013.01); *H01J 2237/20278* (2013.01)
(58) Field of Classification Search
CPC .. H01J 37/20; H01J 37/26; H01J 2237/20207; H01J 2237/20278;
(Continued)

(56) References Cited

U.S. PATENT DOCUMENTS 3,240,934 A * 3/1966 Watanabe ............... H01J 37/20
                                                        250/442.11
3,444,367 A * 5/1969 Alexander .............. H01J 37/20
                                                        250/442.11
(Continued)

FOREIGN PATENT DOCUMENTS

EP        0422655 B1     6/1999
EP        2573795 B1     7/2017
(Continued)

OTHER PUBLICATIONS

Visegrad Patent Institute, International Searching Authority, International Search Report, dated Nov. 25, 2021, in International Application No. PCT/CZ2021/050091, filing date Aug. 23, 2021.
(Continued)

*Primary Examiner* — David A Vanore
(74) *Attorney, Agent, or Firm* — Thedford I. Hitaffer; Hitaffer, PLLC

(57)                    ABSTRACT

A tilting element of a manipulation stage uses a movement apparatus comprising a linear actuator attached to a fixed part and connected to a blade. The blade is attached at an end to a bottom side of a movable part to tilt the movable part relative to the fixed part. A tilt angle of the movable part relative to the fixed part is changed by extending and retracting the movable part of the linear actuator and thus winding and unwinding of the blade on the bottom side of the movable part.

12 Claims, 6 Drawing Sheets

(58) Field of Classification Search
CPC .... H01J 37/28; H01J 2237/26; H01J 2237/28;
H01J 2237/31745
See application file for complete search history.

(56) References Cited

U.S. PATENT DOCUMENTS

| | | | | |
|---|---|---|---|---|
| 3,521,056 A * | 7/1970 | Shigeru | H01J 37/20 | 250/442.11 |
| 3,679,900 A * | 7/1972 | Kimura | H01J 37/18 | 250/441.11 |
| 3,790,155 A * | 2/1974 | Longamore | B23Q 1/5462 | 850/16 |
| 4,818,874 A | 4/1989 | Ishikawa | | |
| 5,149,967 A * | 9/1992 | Otaka | H01J 37/20 | 250/442.11 |
| 5,367,171 A * | 11/1994 | Aoyama | H01J 37/20 | 250/442.11 |
| 5,705,814 A * | 1/1998 | Young | G01Q 30/06 | 250/423 P |
| 5,780,943 A * | 7/1998 | Ono | G03F 7/70691 | 310/90.5 |
| 5,806,193 A * | 9/1998 | Ebihara | B23Q 1/48 | 33/573 |
| 6,403,968 B1 * | 6/2002 | Hazaki | H01J 37/20 | 250/442.11 |
| 6,407,850 B1 * | 6/2002 | Rojo | G02B 21/26 | 359/290 |
| 6,495,838 B1 * | 12/2002 | Yaguchi | H01J 37/20 | 250/443.1 |
| 2004/0265052 A1 * | 12/2004 | Kendall | H01J 37/20 | 403/373 |
| 2007/0023684 A1 * | 2/2007 | Lewis | H01J 37/20 | 250/442.11 |
| 2007/0063148 A1 * | 3/2007 | Miyazaki | H01J 37/20 | 250/442.11 |
| 2008/0099695 A1 * | 5/2008 | Sugizaki | G01N 1/32 | 250/492.1 |
| 2008/0173813 A1 * | 7/2008 | Van De Water | G01N 23/04 | 250/311 |
| 2009/0303306 A1 * | 12/2009 | Fish | H01J 37/20 | 347/171 |
| 2010/0006771 A1 * | 1/2010 | Miyazaki | H01J 37/20 | 250/442.11 |
| 2011/0127427 A1 * | 6/2011 | Nackashi | E04H 4/082 | 250/442.11 |
| 2011/0248165 A1 * | 10/2011 | Damiano, Jr. | H01J 37/20 | 250/442.11 |
| 2012/0085938 A1 * | 4/2012 | Coyle | H01J 37/185 | 250/492.3 |
| 2012/0132802 A1 * | 5/2012 | Arai | H01J 37/08 | 250/423 F |
| 2012/0217391 A1 * | 8/2012 | Shichi | H01J 37/09 | 250/306 |
| 2012/0298884 A1 * | 11/2012 | Nakajima | H01J 37/3056 | 250/453.11 |
| 2014/0231670 A1 * | 8/2014 | Cyrankowski | G21K 5/10 | 250/442.11 |
| 2015/0170873 A1 * | 6/2015 | Miyazaki | H01J 37/20 | 250/442.11 |
| 2015/0325405 A1 * | 11/2015 | Allen | H01J 37/3171 | 250/491.1 |
| 2017/0067800 A1 * | 3/2017 | Briggman | H01J 37/26 | |
| 2017/0271122 A1 * | 9/2017 | Oonishi | H01J 37/20 | |
| 2018/0286628 A1 | 10/2018 | Hasuda | | |
| 2018/0330913 A1 | 11/2018 | Kataoka et al. | | |
| 2023/0021625 A1 * | 1/2023 | Siefering | H01L 21/68 | |

FOREIGN PATENT DOCUMENTS

| | | | | |
|---|---|---|---|---|
| GB | 2386469 A * | 9/2003 | | H01J 37/3171 |
| JP | H09223477 A | 8/1997 | | |
| JP | H11213932 A | 8/1999 | | |
| JP | 2007207683 A * | 8/2007 | | |
| JP | 5278858 B2 | 9/2013 | | |
| WO | WO-2025124626 A1 * | 6/2005 | | H01J 37/20 |
| WO | WO-2013049641 A1 * | 4/2013 | | G02B 21/26 |

OTHER PUBLICATIONS

Visegrad Patent Institute, International Searching Authority, Written Opinion, dated Nov. 25, 2021, in International Application No. PCT/CZ2021/050091, filing date Aug. 23, 2021.

* cited by examiner

TILTING ELEMENT OF MANIPULATION STAGE

CROSS-REFERENCE TO RELATED APPLICATIONS

This application, filed under 35 USC 371, is a United States National Stage Application of International Application No. PCT/CZ2021/050091, filed Aug. 23, 2021, which claims priority to CZ Application No. PV 2020-474, filed on Aug. 27, 2020, the disclosures of which are incorporated herein by reference in their entirety.

TECHNICAL FIELD

The invention relates to a tilting element of a manipulation stage for tilting a sample placed on the tilting element, particularly for manipulation stages used for microscopy, microanalysis, or micromachining.

BACKGROUND OF THE INVENTION

When observing, examining, or processing a sample, especially in microscopy, the sample is usually placed on various manipulation stages ensuring gentle manipulation with the sample being observed. The higher the magnification of the microscope, the greater the need for gentle manipulation with the sample, as an overly rough manipulation with the sample at high magnification would shift the observed, examined, or machined area of the sample out of the field of view of the microscope. In case of gentle manipulation at high magnifications achieved, for example, by electron microscopes, it is also necessary for the movement of the manipulation stages to be sufficiently precise to avoid parasitic movements of the manipulation stage.

Manipulation stages used in microscopy usually allow at least translational movement along two axes, rotation about one axis and tilt about one axis, wherein the greatest parasitic movements of the manipulation stage occur during tilt of the manipulation stage due to radial and axial parasitic movement of the bearings used or other kind of fitting providing the tilt. The possibility to tilt the manipulation stage is important, for example, because of the need to observe the samples from a plurality of angles or when preparing thin lamellae from a sample, the so-called TEM lamellae.

A tiltable manipulation stage with a tilting possibility is described, for example, in the patent application JPH09223477A. The patent application describes two possible embodiments of the manipulation stage. The first possible embodiment of the manipulation stage is such that the parts of the manipulation stage providing the translational movement in two axes and the rotational movement about one axis are placed on the part of the manipulation stage providing the tilt. However, such an embodiment is prone to parasitic movement, since a large part of the manipulation stage, and therefore a large mass, is tilted when the tilt angle changes, due to the placement of the parts of the manipulation stage providing the translational and rotational movement on the part of the manipulation stage providing the tilt. In this case, therefore, a great robustness of the part providing the tilt of the sample is necessary, which makes the manipulation stage more expensive and also increases the demands on the rest of the microscope. Another embodiment of the manipulation stage described by the patent application describes the placement of the part of the manipulation stage providing the tilt on the part providing translational movement in the x-axis direction. On the part of the manipulation stage providing the tilt, parts of the manipulation stage providing rotation about and translational movement in the y-axis direction, which is perpendicular to the x-axis, are further placed. Similarly to the previous embodiment of the manipulation stage, a large part of the manipulation stage, and therefore a large mass, is tilted when the tilt angle changes due to the placement of the part of the manipulation stage providing translational movement in the y-axis direction and rotational movement on the part of the manipulation stage providing the tilt, and therefore the parasitic movement may occur in this embodiment as well. In both cases, the tilt of the manipulation stage is provided by means of an arc guide and worm drive, wherein this kind of guide and drive is unsuitable, as it is demanding in terms of production accuracy, costly, and may cause a vibration transmission between the toothed elements.

A tilting element of a tiltable manipulation stage with a tilting possibility minimizing the parasitic movement when the tilt angle changes is described, for example, in the Japanese patent JP5278858B2. The tilting element of the manipulation stage described by the patent comprises a fixed part and a tilted part, wherein the sides of both parts, which are in contact with each other, have an arc profile that provides the tilt of the tilted part. Further exemplary embodiments further describe the utilization of a groove or a dovetail groove to reduce the parasitic movement of the tilted part. According to this patent, the tilt of the tilted part is performed manually by utilizing a control rod placed in the tilted part which moves in the arc guide groove of the fixed part, wherein the different tilt angles are set by means of the control rod being locked in recesses formed in the guide groove. A disadvantage of such solution is the impossibility of setting an arbitrary tilt angle and the impossibility of machine tilt. Another disadvantage of the described solution of the tilting element of the manipulation stage is the complexity of setting the desired tilt angle.

A scanning electron microscope with a stage that can be shifted in the X-, Y-, and Z-axis direction is further described in the document EP 2 573 795 B1. The stage is both pivotable and tiltable. The movement of this stage is provided by stepper motors. The movement mechanism of the stage further comprises leaf springs.

Another document describing a scanning electron microscope with a pivotable and tiltable manipulation stage is Japanese patent JPH 11213932 A. This document addresses the problem of measuring the stage position using a laser interferometer.

It would therefore be suitable to provide solution for the tilting element of the manipulation stage that would allow for automatic tilt without unwanted parasitic movement.

SUMMARY OF THE INVENTION

The abovementioned objective is achieved by means of a tilting element of a manipulation stage comprising a fixed part, a movable part adapted for placement of at least one sample, and a movement apparatus, wherein the movable part is pivotally mounted on the fixed part, the essence of which lies in the fact that the movement apparatus comprises a blade and a linear actuator, wherein the blade is attached at one end to the bottom side of the movable part and is connected at the opposite end to the linear actuator, which is further connected to the fixed part. The tilting element of the manipulation stage fulfils the abovementioned objective by utilizing a blade that reduces the amount of unwanted parasitic movement in the direction parallel to the tilting axis, since the blade reduces the possibility of movement in that direction by attachment of one end thereof to the bottom side of the movable part.

In a preferred embodiment, at least a part of the bottom side of the movable part has an arc profile in a direction parallel to the tilting axis, wherein the blade is, at the end attached to the bottom side of the movable part, attached to the part of the bottom side of the movable part with the arc profile. Attaching the blade to the part of the bottom side of the movable part with the arc profile improves the accuracy of setting the desired tilt angle, as the blade is wound evenly on the bottom side of the movable part.

In a preferred embodiment, the movement apparatus further comprises a connecting element and at least one linear guide, wherein the connecting element connects the linear actuator to the blade, wherein the connecting element is simultaneously connected to the linear guide oriented parallel to the linear actuator axis and fixedly connected to the fixed part. The use of the described connecting element connecting the blade to the linear actuator and simultaneously connected to the linear guide contributes to the suppression of the parasitic movement in the direction of the tilting axis by limiting the possibility of movement of the end of the blade in the direction of the tilting axis.

In a preferred embodiment, the movement apparatus further comprises at least one torsion spring, the winding of which is placed on the connecting element, wherein its first arm is fixedly connected to the connecting element and its second arm is in contact with the movable part. The use of the torsion spring exerting pressure on the movable part improves the reliability of the correct winding of the blade on the movable part, as it keeps it tensioned the whole time.

In a preferred embodiment, the movement apparatus further comprises at least one torsion spring, the winding of which is placed on the fixed part, wherein its first arm is fixedly connected to the fixed part and its second arm is in contact with the movable part. The use of the torsion spring exerting pressure on the movable part improves the reliability of the correct winding of the blade on the movable part, as it keeps it tensioned the whole time.

In one variant of the tilting element of the manipulation stage, the pivotable mounting of the movable part on the fixed part is implemented such that at least a part of the top side of the fixed part has an arc profile in a direction parallel to the tilting axis, wherein the tilting element of the manipulation stage further comprises at least one arc guide placed on the part of the top side of the fixed part having the arc profile, wherein the outer radius of the arc guide corresponds to the radius of the arc profile of the top side of the fixed part, and, at the same time, the radius of the inner side of the arc guide corresponds to the radius of the arc profile of the bottom side of the movable part, wherein a part of the bottom side of the movable part with the arc profile is placed on the arc guide.

In one variant of the arc guide, the arc guide is composed of a ball cage and at least two rolling elements inserted into the ball cage.

In one variant of the movable portion, the movable portion further comprises a rotary part adapted to rotate about an axis perpendicular to the top side of the movable part, wherein the rotary part is further adapted for the placement of at least one sample.

The above-mentioned objective is further achieved by device with at least one particle source comprising at least one column and a working chamber connected to the columns, wherein the column comprises a particle source and at least one means adapted to guide or direct the particles, the essence of which lies in the fact that it further comprises a manipulation stage with at least one tilting element of the manipulation stage described above placed in the working chamber. The charged particle source device comprising the manipulation stage with the tilting element fulfils the above-mentioned objectives by utilizing the described tilting element.

In one variant of the manipulation stage, the manipulation stage is adapted for tilting about two tilting axes.

DESCRIPTION OF DRAWINGS

A summary of the invention is further described in exemplary embodiments thereof, described with reference to the accompanying drawings, in which.

EXEMPLARY EMBODIMENTS OF THE INVENTION

Figures 1, 2:
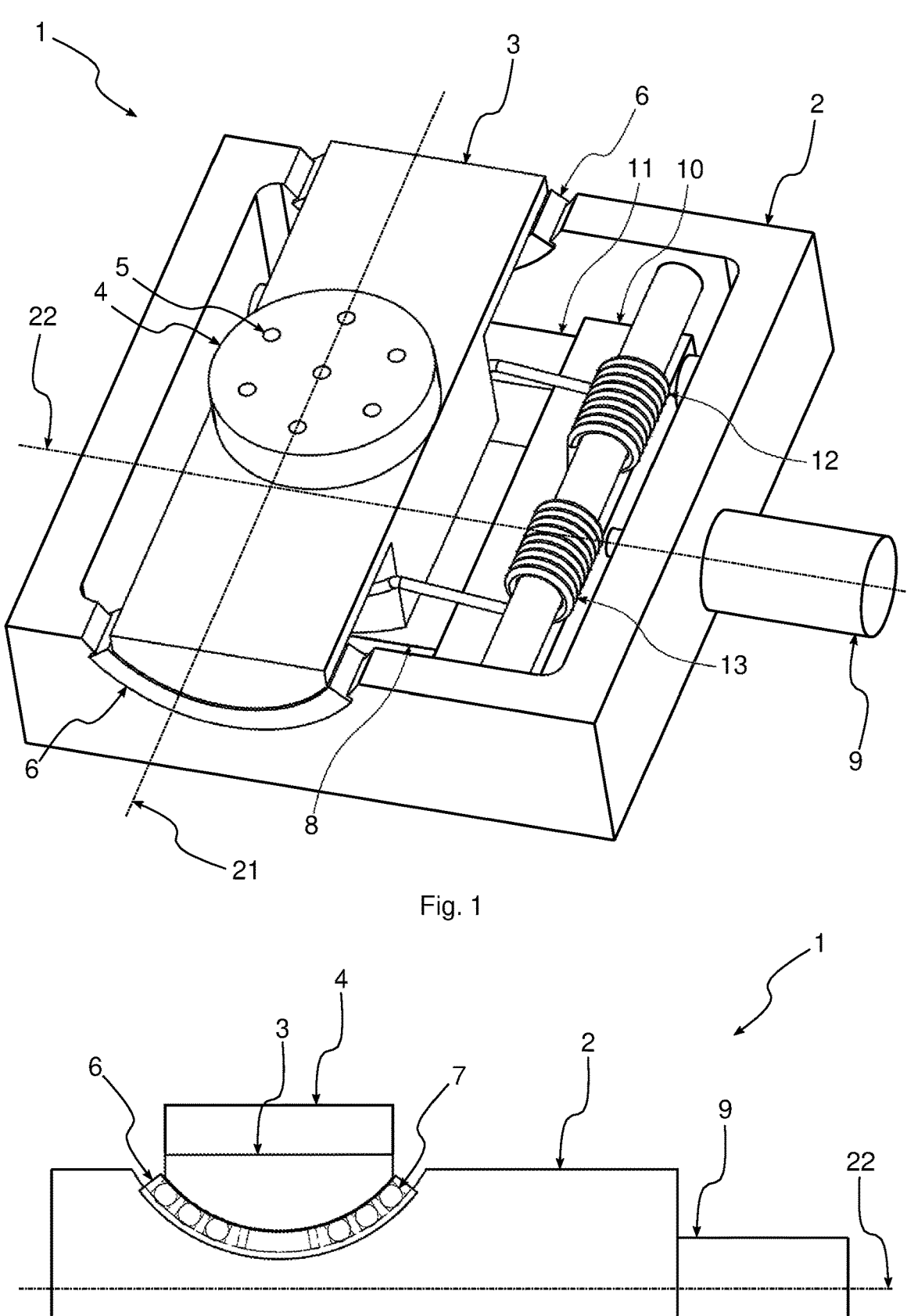
FIG. 1 schematically shows the tilting element of the manipulation stage with a tilt angle of the movable part to the fixed part of 0°, viewed isometrically from above.
FIG. 2 schematically shows the tilting element of the manipulation stage with a tilt angle of the movable part to the fixed part of 0°, viewed from the side.

Said embodiments show exemplary variants of the embodiments of the invention, which, however, have no limiting effect from the point of view of the scope of protection.

An example of the embodiment of the invention is a tilting element 1 of a manipulation stage 15 comprising a fixed part 2, a movable part 3, and a movement apparatus. The movable part 3 is pivotally mounted on the fixed part 2.

In the first exemplary embodiment of the pivotable mounting of the movable part 3 on the fixed part 2, the mounting is realized by at least one rod inserted in each case into an opening in the fixed part 2 and into an opening in the movable part 3, wherein the openings are in the sides of the movable part 3 and the fixed part 2 perpendicular to the tilting axis 21. In the second exemplary embodiment of the pivotable mounting of the movable part 3 on the fixed part 2, the tilting element 1 of the manipulation stage 15 further comprises at least one arc guide. In this exemplary embodiment, at least a part of the bottom side of the movable part

3 has an arc profile in a direction parallel to the tilting axis 21. In this exemplary embodiment, at least a part of the top side of the fixed part 2 further has an arc profile, in a direction parallel to the tilting axis 21, radius of which corresponds to the radius of the outer side of the arc guide, and, at the same time, the radius of the inner side of the arc guide corresponds to the radius of the arc profile of the bottom side of the movable part 3. Thus, in this exemplary embodiment, the pivotable mounting of the movable part 3 on the fixed part 2 is performed by placing the arc guide on the part of the top side of the fixed part 2 with the arc profile, wherein the part of the bottom side of the movable part 3 with the arc profile is placed on the arc guide.

In the first exemplary embodiment of the arc guide, the arc guide is a ball cage 6 with at least two rolling elements inserted into the ball cage 6. The rolling elements are, for example, bearing balls 7 or bearing rollers. Thus, in this exemplary embodiment, the part of the top side of the fixed part 2 with the arc profile has a radius that corresponds to the radius of the outer side of the ball cage 6, and, at the same time, the radius of the inner side of the ball cage 6 corresponds to the radius of the arc profile of the bottom side of the movable part 3. Thus, in this exemplary embodiment, the pivotable mounting of the movable part 3 on the fixed part 2 is performed by placing the ball cage 6 with the rolling elements on the part of the top side of the fixed part 2 with the arc profile, wherein the part of the bottom side of the movable part 3 with the arc profile is placed on the ball cage 6 with the rolling elements. In this exemplary embodiment, the individual corresponding radii mean such radii that allow normal function of the pivotable mounting, thus, free rolling of the rolling elements on the part of the top side of the fixed part 2 with the arc profile and on the part of the bottom side of the movable part 3 with the arc profile. In a further exemplary embodiment of the arc guide, the arc guide is any guide using, for example, dovetail grooves and a corresponding counterpart, simple grooves, or any other suitable connection providing guide for the movable part 3 relative to the fixed part 2.

The movable part 3 is adapted for the placement of at least one sample. In the first exemplary embodiment of the adaptation of the movable part 3 for the placement of the sample, openings 5 are formed in the movable part 3 for inserting stubs (a special sample holder of a usually circular shape, used in particular in electron microscopy). In a further exemplary embodiment of the adaptation of the movable part 3 for the placement of the sample, the movable part 3 comprises pressure arms used for fastening slides.

In an exemplary embodiment of the movable part 3, the movable part 3 comprises a rotary part 4, which is adapted to rotate about an axis perpendicular to the top side of the movable part 3. The rotary part 4 is adapted in this exemplary embodiment for the placement of at least one sample.

The movement apparatus comprises a blade 8 and a linear actuator. The linear actuator means any device capable of generating linear movement of its movable part, such a linear drive is therefore, for example, any device from the group of mechanical linear actuator, hydraulic linear actuator, pneumatic linear actuator, piezoelectric linear actuator, electromechanical linear actuator 9, or the so-called TCP ("Twisted and Coiled Polymer") linear actuator. The blade 8 is meant to be a strip of thin material made of one of the materials from the group of steel, stainless steel, bronze, titanium, and titanium alloy. The thickness of the blade 8 is from 0.05 mm to 0.2 mm. The blade 8 is attached to the bottom side of the movable part 3 at one end and connected to the linear actuator at the other end. In the first exemplary embodiment of the shape of the bottom side of the movable part 3, a part of the bottom side of the movable part 3 in the direction parallel to the tilting axis 21 has an arc profile, wherein the blade 8 is attached to this part of the bottom side of the movable part 3. In another exemplary embodiment of the shape of the bottom side of the movable part 3, a part of the bottom side of the movable part 3 in the direction parallel to the tilting axis 21 has a flat profile, wherein the blade is attached to this part of the bottom side of the movable part 3. In another exemplary embodiment of the shape of the bottom side of the movable part 3, a part of the bottom side of the movable part 3 in the direction parallel to the tilting axis 21 has a pointed profile, wherein the blade 8 is attached to this part of the bottom side of the movable part 3. In another exemplary embodiment of the shape of the bottom side of the movable part 3, a part of the bottom side of the movable part 3 in the direction parallel to the tilting axis 21 has an oval profile, wherein the blade 8 is attached to this part of the bottom side of the movable part 3. The linear actuator is further connected to the fixed part 2. In the first exemplary embodiment of the linear actuator connection, the linear actuator is non-movably connected to the fixed part 2 by its non-movable part and is connected to the blade 8 by its movable part. In the second exemplary embodiment of the linear actuator connection, the linear actuator is connected to the blade 8 by its non-movable part and is connected to the fixed part 2 by its movable part. In the first exemplary embodiment of the connection of the linear actuator to the blade 8, the linear actuator is connected to the blade 8 directly, for example by screwing or by a pivotable joint. In the second exemplary embodiment of the connection of the linear actuator to the blade 8, the movement apparatus further comprises a connecting element 10 and at least one linear guide 11. In this exemplary embodiment, the linear actuator is connected to the blade 8 indirectly by the connecting element 10. The linear actuator is connected to the connecting element 10. The blade 8 is connected to the connecting element 10. The connecting element 10 is connected to at least one linear guide 11 oriented parallel to the linear actuator axis 22 and fixedly connected to the fixed part 2.

The movement apparatus further comprises one or two torsion springs. In the first exemplary placement of the at least one torsion spring, the connecting element 10 is adapted for the placement of the winding of the torsion spring placed thereon. Further, the first arm of the torsion spring is fixedly connected to the connecting element 10 and the second arm of the torsion spring is in contact with the movable part 3. The winding of the torsion spring is placed on the connecting element 10, and also the first arm of the torsion spring is connected to the connecting element 10 such that the second arm of the torsion spring is oriented parallel to the surface of the movable part 3 perpendicular to the tilting axis 21 of the movable part 3. In the second exemplary placement of the at least one torsion spring, the fixed part 2 is adapted for the placement of the winding of the torsion spring placed thereon. Further, the first arm of the torsion spring is fixedly connected to the fixed part 2 and the second arm of the torsion spring is in contact with the movable part 3. The winding of the torsion spring is placed on the fixed part 2, and also the first arm of the torsion spring is connected to the fixed part 2 such that the second arm of the torsion spring is oriented parallel to the surface of the movable part 3 perpendicular to the tilting axis 21 of the movable part 3.

The second arm of the torsion spring is always in contact with the movable part 3 via any contact component from the group of bearing 14, rollerboy, or pulley. The contact is provided such that the movable part 3 comprises the same number of contact components as the number of torsion springs, wherein the contact components are placed on the sides of the movable part 3 perpendicular to the tilting axis 21 of the movable part 3, and at the same time, there is only one contact component on each of the said sides. The torsion spring and the respective contact component are always placed such that the second arm of the torsion spring moves on the given contact component and thus creates pressure on the movable part 3 in the direction opposite to the direction in which the blade 8 acts on the movable part 3 by pulling, thus causing the blade 8 to be tensioned at any tilt of the movable part 3.

The device with at least one particle source comprising at least one column 17, a working chamber 16 connected to the column 17, and a pumping device. The pumping device is connected to the column 17 and the working chamber 16 and is adapted to pump gases therefrom such that the value of the gas pressure in the column 17 and the working chamber 16 is below the atmospheric pressure. The column 17 comprises a particle source and at least one means adapted to guide or direct the particles. The particle source is an uncharged particle source, a charged particle source 20, or both. The device with at least one particle source further comprises a manipulation stage 15 with at least one tilting element 1 described above. In one of the exemplary embodiments of the device with at least one particle source, the device with at least one particle source comprises the manipulation stage 15 with two tilting elements 1 arranged on top of each other, wherein the manipulation stage 15 thus allows for a simultaneous tilting about two tilting axes 21. The manipulation stage 15 with at least one tilting element 1 is placed in the working chamber 16.

Figures 9, 10:
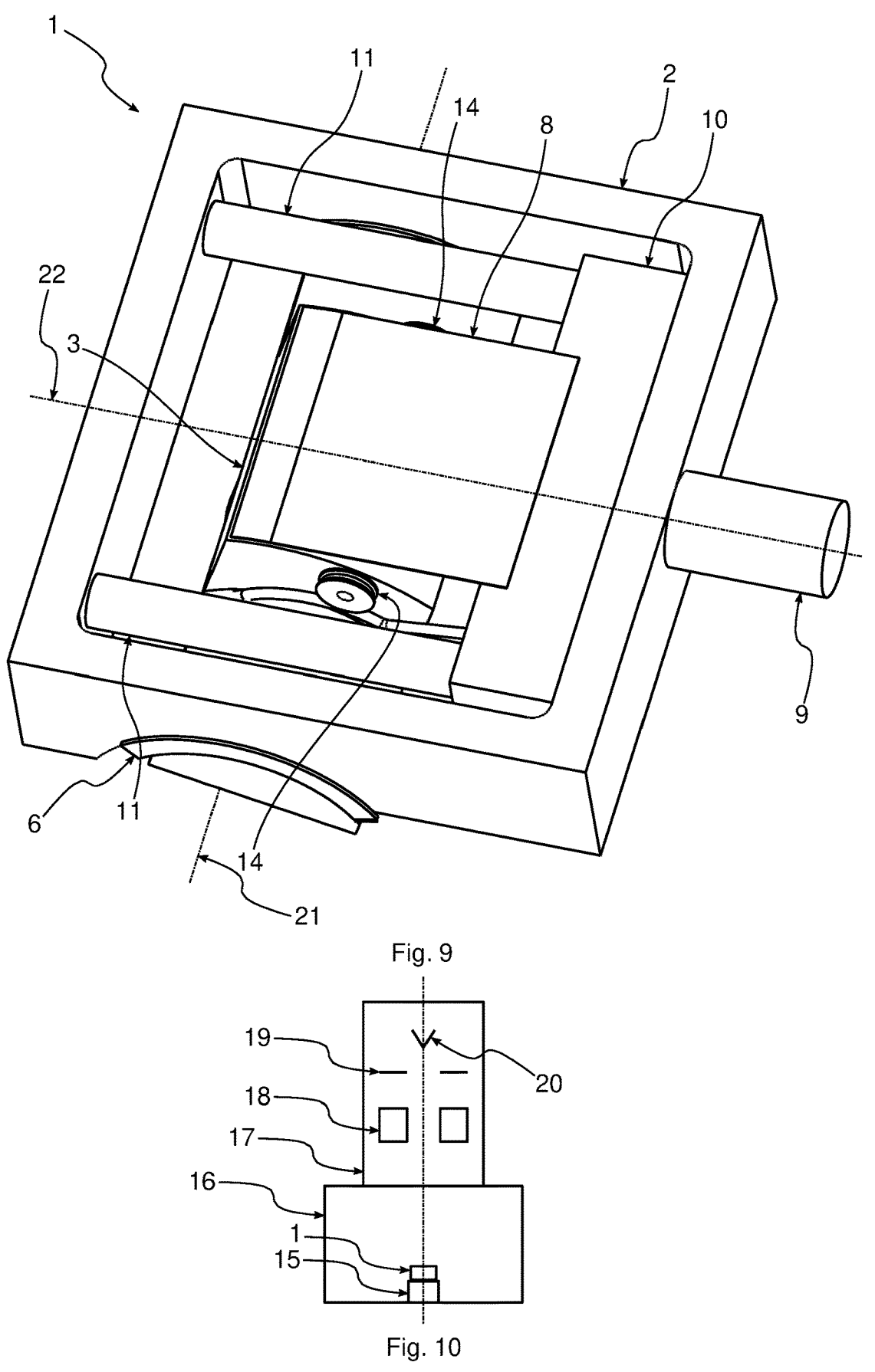
FIG. 9 schematically shows the tilting element of the manipulation stage with a tilt angle of the movable part to the fixed part of −20°, viewed isometrically from below.
FIG. 10 schematically shows a device with at least one particle source.

In the exemplary embodiment of the device with at least one particle source, which is the charged particle source 20 visible in FIG. 10, the means adapted to guide or direct the particles are at least one lens 19 and at least one deflector 18. The lens 19 is adapted to shape the charged particle beam or to focus the charged particle beam onto the sample surface. The deflector 18 is adapted to influence the direction of propagation of the beam.

The charged particle source device is any device from the group of a scanning electron microscope, a transmission electron microscope, a focused ion beam source device, an optical microscope, or a combination thereof.

In the specific exemplary embodiment of the invention visible in FIGS. 1, 2, 3, 4, 5, 6, 7, 8, and 9, the tilting element 1 of the manipulation stage 15 comprising the fixed part 2, the movable part 3, and the movement apparatus is shown. The movable part 3 comprises the rotary part 4 with openings 5 for the placement of the stubs with the samples. The movable part 3 is pivotally mounted on the fixed part 2. A part of the bottom side of the movable part 3 has an arc profile in a direction parallel to the tilting axis 21. The tilting element 1 of the manipulation stage 15 comprises two ball cages 6 and twelve bearing balls 7 placed in groups of six in each ball cage 6. A part of the top side of the fixed part 2 has an arc profile with a radius of 30 mm. The outer side of the ball cage 6 has a radius of 29.8 mm and the inner side of the ball cage 6 has a radius of 26.2 mm. The diameter of the bearing balls 7 is 4 mm. The ball cages 6 with the bearing balls 7 are placed on the part of the top side of the fixed part 2 with the arc profile, and the movable part 3 is further placed thereon, wherein it is placed thereon via parts of the bottom side of the movable part 3 with the arc profile having a radius of 26 mm. The movement apparatus comprises the

Figure 3:
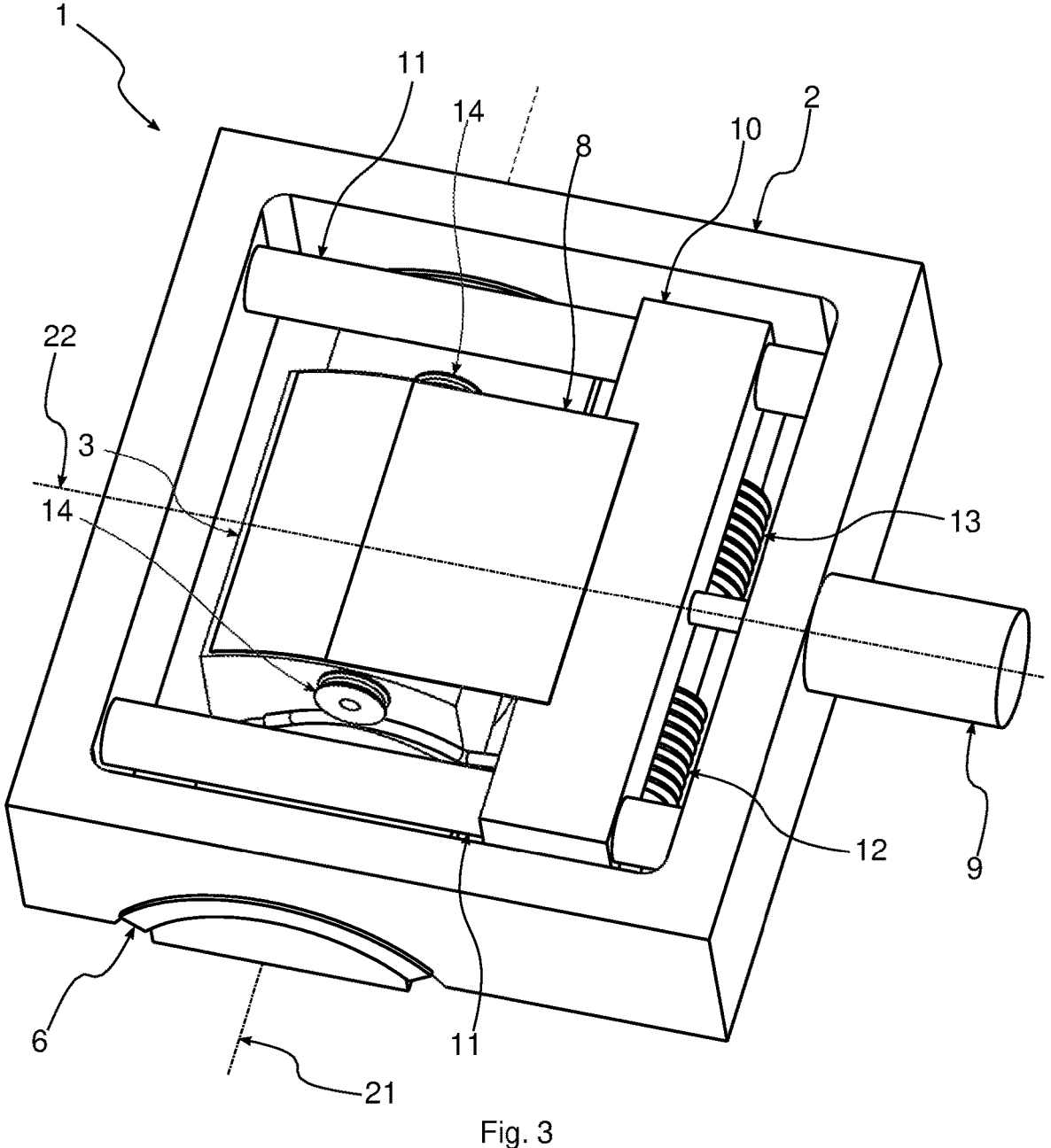
FIG. 3 schematically shows the tilting element of the manipulation stage with a tilt angle of the movable part to the fixed part of 0°, viewed isometrically from below.
Figures 4, 5:
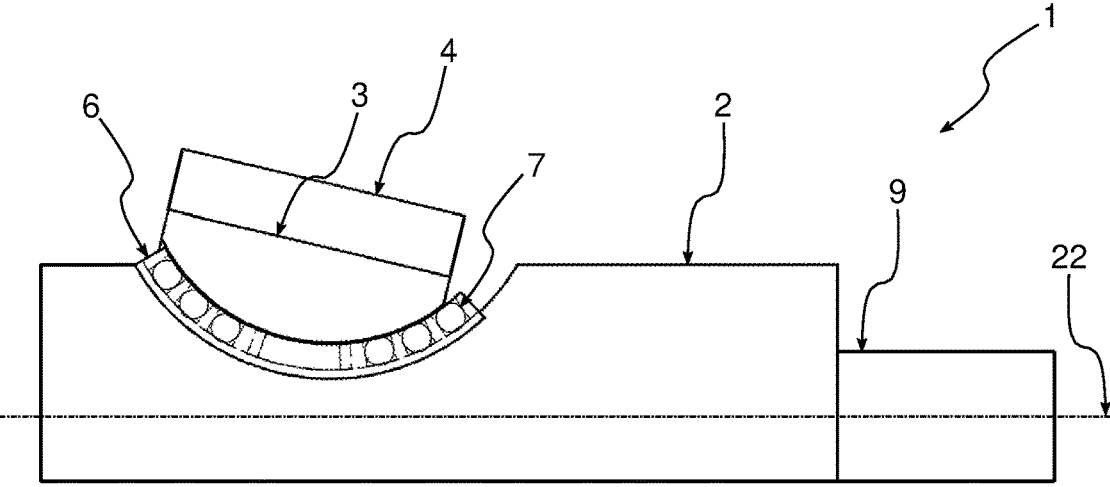
FIG. 4 schematically shows the tilting element of the manipulation stage with a tilt angle of the movable part to the fixed part of 20°, viewed isometrically from above.
FIG. 5 schematically shows the tilting element of the manipulation stage with a tilt angle of the movable part to the fixed part of 20°, viewed from the side.
Figure 6:
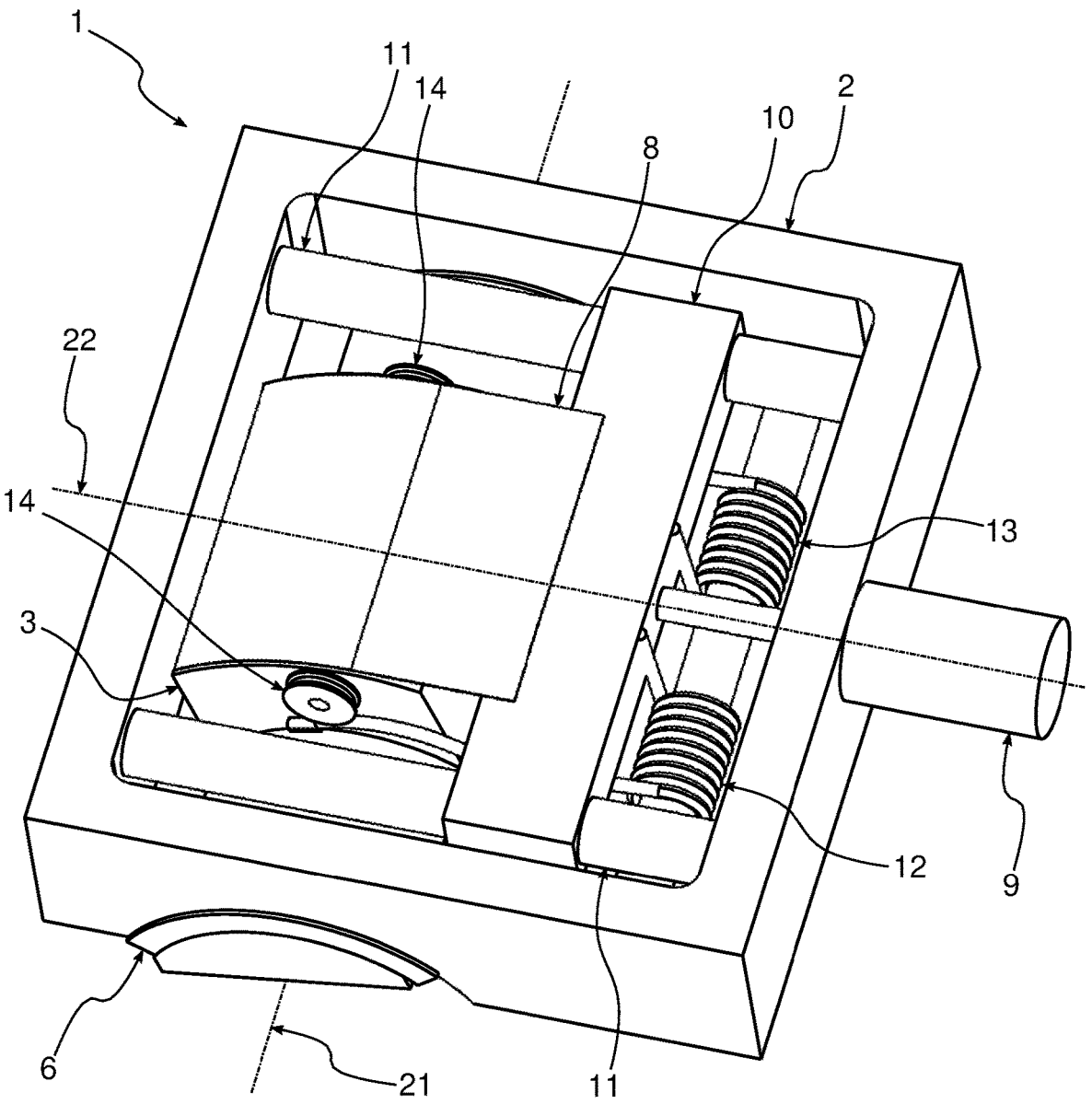
FIG. 6 schematically shows the tilting element of the manipulation stage with a tilt angle of the movable part to the fixed part of 20°, viewed isometrically from below.
Figures 7, 8:
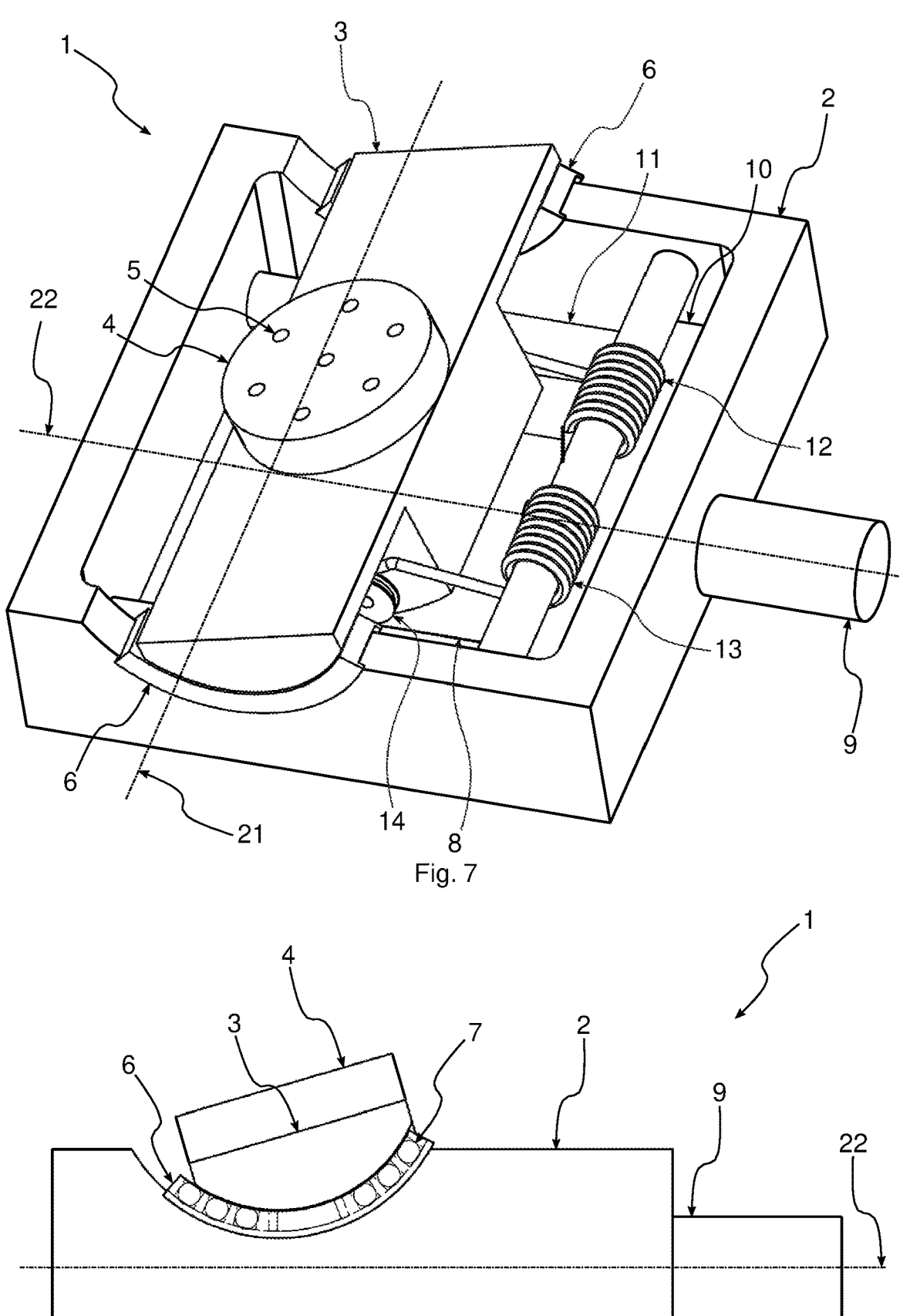
FIG. 7 schematically shows the tilting element of the manipulation stage with a tilt angle of the movable part to the fixed part of −20°, viewed isometrically from above.
FIG. 8 schematically shows the tilting element of the manipulation stage with a tilt angle of the movable part to the fixed part of −20°, viewed from the side.

8 blade 8, the linear actuator which is the electromechanical linear actuator 9, the connecting element 10, two linear guides 11, right-hand torsion spring 13, and left-hand torsion spring 12. The linear guide 11 is fixedly connected to the fixed part 2 and to the connecting element 10. The connecting element 10 is further connected to the movable part of the electromechanical linear actuator 9, wherein the non-movable part of the electromechanical linear actuator 9 is fixedly connected to the fixed part 2. The connecting element 10 is further connected by the blade 8 at one end thereof, wherein at the opposite end it is connected to the part of the bottom side of the movable part 3 with the arc profile having a radius of 43.2 mm. Further, the left-hand torsion spring 12 and the right-hand torsion spring 13 are placed on the connecting element 10, wherein one arm of these torsion springs is fixedly connected to the connecting element 10. The movable part 3 further comprises two contact components, which are bearings 14, wherein each of the bearings 14 is placed on one side of the movable part 3 perpendicular to the tilting axis 21 of the movable part 3. The left-hand and right-hand torsion springs 12, 13 are at the same time placed on the connecting element 10 such that the second arm of the respective torsion spring is in sliding contact with the bearing 14 that is placed on the movable part 3. In FIGS. 1, 2, and 3, the movable part 3 can be seen in a position where the tilt angle of the movable part 3 relative to the fixed part 2 is 0°. In FIGS. 4, 5, and 6, it is possible to see the movable part 3 in a position where the tilt angle of the movable part 3 relative to the fixed part 2 is 20°, wherein the movable part 3 has reached this position by the movable part of the electromechanical linear actuator 9 gradually extending up to the maximum value, which led to the translational displacement of the connecting element 10 and also the winding of the blade 8 onto the bottom side of the movable part 3 with the arc profile, wherein the tensioning of the blade 8 was provided by the left-hand torsion spring 12 and the right-hand torsion spring 13 pressing on the bearings 14. In FIGS. 7, 8, and 9, it is possible to see the movable part 3 in a position where the tilt angle of the movable part 3 relative to the fixed part 2 is −20°, wherein the movable part 3 has reached this position by the movable part of the electromechanical linear actuator 9 gradually retracting up to the maximum value, which led to the translational displacement of the connecting element 10 and also the unwinding of the blade 8 from the bottom side of the movable part 3 with the arc profile, wherein the tensioning of the blade 8 was provided by the left-hand torsion spring 12 and the right-hand torsion spring 13 pressing on the bearings 14.

LIST OF REFERENCE NUMERALS

1—tilting element of the manipulation stage
    2—fixed part
    3—movable part
    4—rotary part
    5—opening
    6—ball cage
    7—bearing balls
    8—blade
    9—electromechanical linear actuator
    10—connecting element
    11—linear guide
    12—left-hand torsion spring
    13—right-hand torsion spring
    14—bearing
    15—manipulation stage 16—working chamber
17—column
18—deflector
19—lens
20—charged particle source
21—tilting axis
22—linear actuator axis

The invention claimed is:

1. A tilting element of a manipulation stage comprising:
a fixed part,
a movable part adapted for the placement of at least one sample, and
a movement apparatus, wherein the movable part is pivotally mounted on the fixed part, and wherein the movement apparatus comprises a blade and a linear actuator, wherein the blade is attached at one end to a bottom side of the movable part and is connected at an opposite end to the linear actuator, which is further connected to the fixed part.

2. The tilting element of the manipulation stage of claim 1, wherein at least a part of the bottom side of the movable part has an arc profile in a direction parallel to a tilting axis.

3. The tilting element of the manipulation stage of claim 2, wherein the blade is attached at the end attached to the bottom side of the movable part to a part of the bottom side of the movable part with the arc profile.

4. The tilting element of the manipulation stage of claim 1, further comprising a connecting element and at least one linear guide, wherein the connecting element connects the linear actuator to the blade, and wherein the connecting element is simultaneously connected to the linear guide oriented parallel to an axis of the linear actuator and fixedly connected to the fixed part.

5. The tilting element of the manipulation stage of claim 4, further comprising at least one torsion spring, a winding of which is placed on the connecting element, wherein a first arm of the torsion spring is fixedly connected to the connecting element and a second arm of the torsion spring is in contact with the movable part.

6. The tilting element of the manipulation stage of claim 1, further comprising at least one torsion spring, a winding of which is placed on the fixed part, wherein a first arm of the torsion spring is fixedly connected to the fixed part and a second arm of the torsion spring is in contact with the movable part.

7. The tilting element of the manipulation stage of claim 1, wherein the movable part further comprises a rotary part adapted to rotate about an axis perpendicular to a top side of the movable part, wherein the rotary part is further adapted for placement of at least one sample.

8. A charged particle source device in combination with the tilting element of the manipulation stage of claim 1, the device comprising at least one column and a working chamber connected to the column, wherein the column comprises at least one particle source and at least one guide adapted to guide or direct particles from the particle source, and wherein the manipulation stage is placed in the working chamber.

9. The charged particle source device of claim 8, wherein the manipulation stage is adapted for tilting about two tilting axes.

10. A tilting element of a manipulation stage comprising:
a fixed part,
a movable part adapted for the placement of at least one sample, and
a movement apparatus, wherein the movable part is pivotally mounted on the fixed part, and wherein the movement apparatus comprises a flexible blade and a linear actuator, wherein the blade is attached at one end to a bottom side of the movable part and is connected at an opposite end to the linear actuator, which is further connected to the fixed part, wherein the blade is configured to conform to the bottom side of the movable part during tilting.

11. A tilting element of a manipulation stage comprising:
a fixed part;
a movable part adapted for the placement of at least one sample;
wherein the movable part is pivotally mounted on the fixed part such that at least a part of a top side of the fixed part has an arc profile in a direction parallel to a tilting axis; and
at least one arc guide placed on the part of the top side of the fixed part with the arc profile; wherein an outer radius of the arc guide corresponds to a radius of the arc profile of the top side of the fixed part and at the same time a radius of an inner side of the arc guide corresponds to a radius of an arc profile of a bottom side of the movable part; and wherein a part of the bottom side of the movable part with the arc profile is placed on the arc guide.

12. The tilting element of the manipulation stage of claim 11, wherein the arc guide comprises a ball cage and at least two rolling elements inserted in the ball cage.

* * * * *